(12) United States Patent
Kang et al.

(10) Patent No.: US 10,261,976 B2
(45) Date of Patent: Apr. 16, 2019

(54) METHOD AND APPARATUS FOR MODELING SMOKE TURBULENCE BASED ON PATCH

(71) Applicants: SAMSUNG ELECTRONICS CO., LTD., Suwon-si (KR); Technische Universität München, Munich (DE)

(72) Inventors: Nahyup Kang, Seoul (KR); Mengyu Chu, Munich (DE); Nils Thuerey, Munich (DE); Hyong Euk Lee, Suwon-si (KR); Donghoon Sagong, Suwon-si (KR)

(73) Assignees: Samsung Electronics Co., Ltd., Suwon-si (KR); TECHNISCHE UNIVERSITÄT MÜNCHEN, Munich (DE)

( * ) Notice: Subject to any disclaimer, the term of this patent is extended or adjusted under 35 U.S.C. 154(b) by 239 days.

(21) Appl. No.: 15/191,743

(22) Filed: Jun. 24, 2016

(65) Prior Publication Data

US 2017/0178344 A1    Jun. 22, 2017

(30) Foreign Application Priority Data

Dec. 18, 2015 (KR) .................. 10-2015-0181546

(51) Int. Cl.
| | |
|---|---|
| *G06T 3/40* | (2006.01) |
| *G06F 17/14* | (2006.01) |
| *G06K 9/62* | (2006.01) |
| *G06F 17/50* | (2006.01) |
| *G06T 7/11* | (2017.01) |
| *G06T 7/44* | (2017.01) |
| *G06K 9/00* | (2006.01) |

(Continued)

(52) U.S. Cl.
CPC .......... *G06F 17/14* (2013.01); *G06F 17/5009* (2013.01); *G06K 9/00771* (2013.01);
(Continued)

(58) Field of Classification Search
CPC ... G06F 17/14; G06F 17/5009; G06K 9/6857; G06K 9/4671; G06K 9/00771;
(Continued)

(56) References Cited

U.S. PATENT DOCUMENTS

| | | |
|---|---|---|
| 7,710,424 B1 | 5/2010 | Hutchins et al. |
| 8,725,476 B1 | 5/2014 | Losasso Petterson |

(Continued)

FOREIGN PATENT DOCUMENTS

| | | |
|---|---|---|
| KR | 10-2008-0091220 A | 10/2008 |
| KR | 10-2012-0118465 A | 10/2012 |
| KR | 10-2012-0123132 A | 11/2012 |

OTHER PUBLICATIONS

Yuan, Feiniu. "Video-based smoke detection with histogram sequence of LBP and LBPV pyramids." Fire safety journal 46, No. 3 (2011): 132-139.*

(Continued)

*Primary Examiner* — Carol Wang
(74) *Attorney, Agent, or Firm* — NSIP Law

(57) ABSTRACT

A method and apparatus for modeling smoke turbulence is disclosed. The method of modeling smoke turbulence includes detecting a turbulent area comprising smoke turbulence in a low-resolution image, and searching for a high-resolution patch matching the turbulent area in a memory that comprises high-resolution patches representing smoke turbulence extracted from high-resolution images. The method also models the smoke turbulence by synthesizing the retrieved patch to the low-resolution image.

18 Claims, 12 Drawing Sheets

(51) Int. Cl.
*G06K 9/46* (2006.01)
*G06K 9/68* (2006.01)

(52) U.S. Cl.
CPC ......... *G06K 9/4671* (2013.01); *G06K 9/6212* (2013.01); *G06K 9/6857* (2013.01); *G06T 3/4053* (2013.01); *G06T 7/11* (2017.01); *G06T 7/44* (2017.01)

(58) Field of Classification Search
CPC ........... G06K 9/6212; G06T 7/11; G06T 7/44; G06T 3/4053; G06T 2207/20016
See application file for complete search history.

(56) References Cited

U.S. PATENT DOCUMENTS

| | | |
|---|---|---|
| 8,760,449 B1 | 6/2014 | Horvath |
| 8,781,805 B1 | 7/2014 | Sachs et al. |
| 2012/0288015 A1* | 11/2012 | Zhang ..................... H04N 7/54 375/240.26 |
| 2013/0279803 A1* | 10/2013 | Cetin ................... G06K 9/4609 382/165 |
| 2014/0105515 A1 | 4/2014 | Zhu et al. |
| 2014/0267918 A1 | 9/2014 | Medasani et al. |

OTHER PUBLICATIONS

Gonzalez-Gonzalez, R., V. Alarcon-Aquino, R. Rosas-Romero, O. Starostenko, J. Rodriguez-Asomoza, and J. M. Ramirez-Cortes. "Wavelet-based smoke detection in outdoor video sequences." In Circuits and Systems (MWSCAS), 2010 53rd IEEE International Midwest Symposium on, pp. 383-387. IEEE, 2010.*

Kim, T., et al., "Wavelet turbulence for fluid simulation," ACM Transactions on Graphics (TOG), vol. 27. No. 3., 2008 (6 pages).

* cited by examiner

1200

METHOD AND APPARATUS FOR MODELING SMOKE TURBULENCE BASED ON PATCH

CROSS-REFERENCE TO RELATED APPLICATION(S)

This application claims the benefit under 35 USC 119(a) of Korean Patent Application No. 10-2015-0181546 filed on Dec. 18, 2015, in the Korean Intellectual Property Office, the entire disclosure of which is incorporated herein by reference for all purposes.

BACKGROUND

1. Field

The following description relates to a method and apparatus to model smoke turbulence based on a patch.

2. Description of Related Art

A height field-based fluid dynamics modeling method may be representative in a real-time fluid modeling field. Although the height field-based fluid dynamic modeling method enables simple modeling and rapid computation or calculation, a fluid may be simply expressed or a sense of reality may deteriorate.

A method of reproducing a fluid flow through full three-dimensional (3D) modeling includes obtaining a value of Navier-Stokes equations at a sample point by dividing 3D particles or a grid. Although such a method reproduces a physically suitable fluid flow, an amount of computation to be processed is large and; thus, real-time modeling is not readily performed.

Thus, it may not be easy to model, in real time, a fluid at a high resolution.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a method of modeling smoke turbulence, including: detecting a turbulent area including smoke turbulence in a low-resolution image; searching for a high-resolution patch matching the turbulent area in a memory that may also include high-resolution patches representing smoke turbulence extracted from high-resolution images; and modeling the smoke turbulence by synthesizing the retrieved patch to the low-resolution image.

The memory may also include a patch library including the high-resolution patches representing types of smoke turbulence extracted from the high-resolution images.

The detecting of the turbulent area may also include generating particles traceable in a low-resolution velocity field, and detecting the turbulent area in the low-resolution image based on a movement of the particles.

The generating of the traceable particles may also include generating the particles in neighboring areas including an area in which a smoke occurs in the low-resolution image, and the detecting of the turbulent area may also include detecting a boundary area from a smoke distribution in the low-resolution image by tracing the movement of the particles.

The detecting of the boundary area may also include extracting a gradient of a smoke distribution at a location of each of the particles, and determining whether the particles are present in the boundary area based on a result of comparing the gradient of the smoke distribution to a threshold value.

The method may also include in response to presence of the particles in the boundary area, defining a first descriptor to correspond to a smoke distribution in the boundary area.

The searching for the high-resolution patch may also include searching the memory for a patch indicating a smoke distribution similar to a smoke distribution in the turbulent area.

The modeling of the smoke turbulence may also include synthesizing the retrieved patch to the low-resolution image by adjusting a density scale and an orientation of the retrieved patch based on a physical quantity of a smoke in the turbulent area.

The searching for the high-resolution patch may also include searching the memory for patches matching second descriptors corresponding to locations of the particles in the boundary area changed over time.

The searching for the high-resolution patch may also include calculating a difference between second descriptors, which comprise descriptors corresponding to the retrieved patches and descriptors having temporal continuity with other second descriptors, and the first descriptor corresponding to the second descriptors corresponding to the changed locations of the particles, in response to the calculated difference being less than or equal to a preset value, determining a patch corresponding to the second descriptors having the temporal continuity with the second descriptors corresponding to the retrieved patches to be the high-resolution patch matching the turbulent area, and in response to the calculated difference being greater than the preset value, determining a new patch retrieved from the memory to be the high-resolution patch matching the turbulent area.

The patch library may also include at least one of the high-resolution patches representing a movement of particles in types of smoke turbulence over time, second descriptors corresponding to the patches, and identifiers of the patches, and wherein the patches are stored in association with respective locations of the particles, and the patches including temporal continuity are stored in association therewith.

The searching further may also include calculating a difference between a first descriptor and second descriptors, wherein the second descriptors correspond to at least one of retrieved patches and having temporal continuity, and the first descriptor corresponds to a changed location of particles, in response to the difference being less than or equal to a preset value, determining a patch corresponding to the second descriptors to be a high-resolution patch matching a turbulent area, and in response to the difference being greater than the preset value, determining a new patch retrieved from a patch library to be the high-resolution patch matching the turbulent area.

The difference between the first descriptor and the second descriptors is defined as a difference between a Euclidean distance between the first descriptor and the second descriptors.

In accordance with an embodiment, there is provided a precomputation method for modeling smoke turbulence, including: generating particles in an area in a high-resolution image in which a smoke occurs; extracting, as patches of a predefined size, a smoke distribution corresponding to a location of each of the particles; and storing, in a memory, the extracted patches with corresponding locations of the particles.

The extracting may also include extracting, as the patches of the predefined size, the smoke distribution corresponding to a location of each of the particles by manually moving the particles in a high-resolution velocity field.

The extracting may also include extracting, as the patches of the predefined size, a feature of a boundary area of the smoke distribution corresponding to a location of each of the particles.

The extracted patches have a same lifetime as a lifetime preset for the particles.

The patches comprise second descriptors defined to correspond to changed locations of the particles in the smoke distribution, and patches having temporal continuity among the patches are stored in association therewith.

In accordance with an embodiment, there is provided an apparatus for modeling smoke turbulence, including: a memory configured to store patches representing smoke turbulence extracted from high-resolution images; and a processor configured to detect a turbulent area of a low-resolution image in which smoke turbulence occurs, and model the smoke turbulence by synthesizing, to the low-resolution image, a high-resolution patch retrieved from the memory and matching the turbulent area.

The processor is configured to generate particles in neighboring areas including an area in which a smoke occurs in the low-resolution image, and detect a boundary area from a smoke distribution in the low-resolution image by tracing a movement of the particles.

The processor is configured to extract a gradient of the smoke distribution at a location of each of the particles, and define a first descriptor corresponding to a smoke distribution in the boundary area by determining whether the particles are present in the boundary area, based on a comparison of the gradient of the smoke distribution to a threshold value.

The processor is configured to search the patch library for patches matching second descriptors that correspond to locations of the particles in the boundary area changed over time.

The processor is configured to calculate a difference between second descriptors, which comprise descriptors corresponding to the retrieved patches and descriptors having temporal continuity with other second descriptors, and the first descriptor corresponding to the second descriptors corresponding to the changed locations of the particles, and determine a patch to be the high-resolution patch that corresponds to the second descriptors or a new patch retrieved from the patch library based on a result of comparing the calculated difference to a preset value.

Other features and aspects will be apparent from the following detailed description, the drawings, and the claims.

Figure 1:
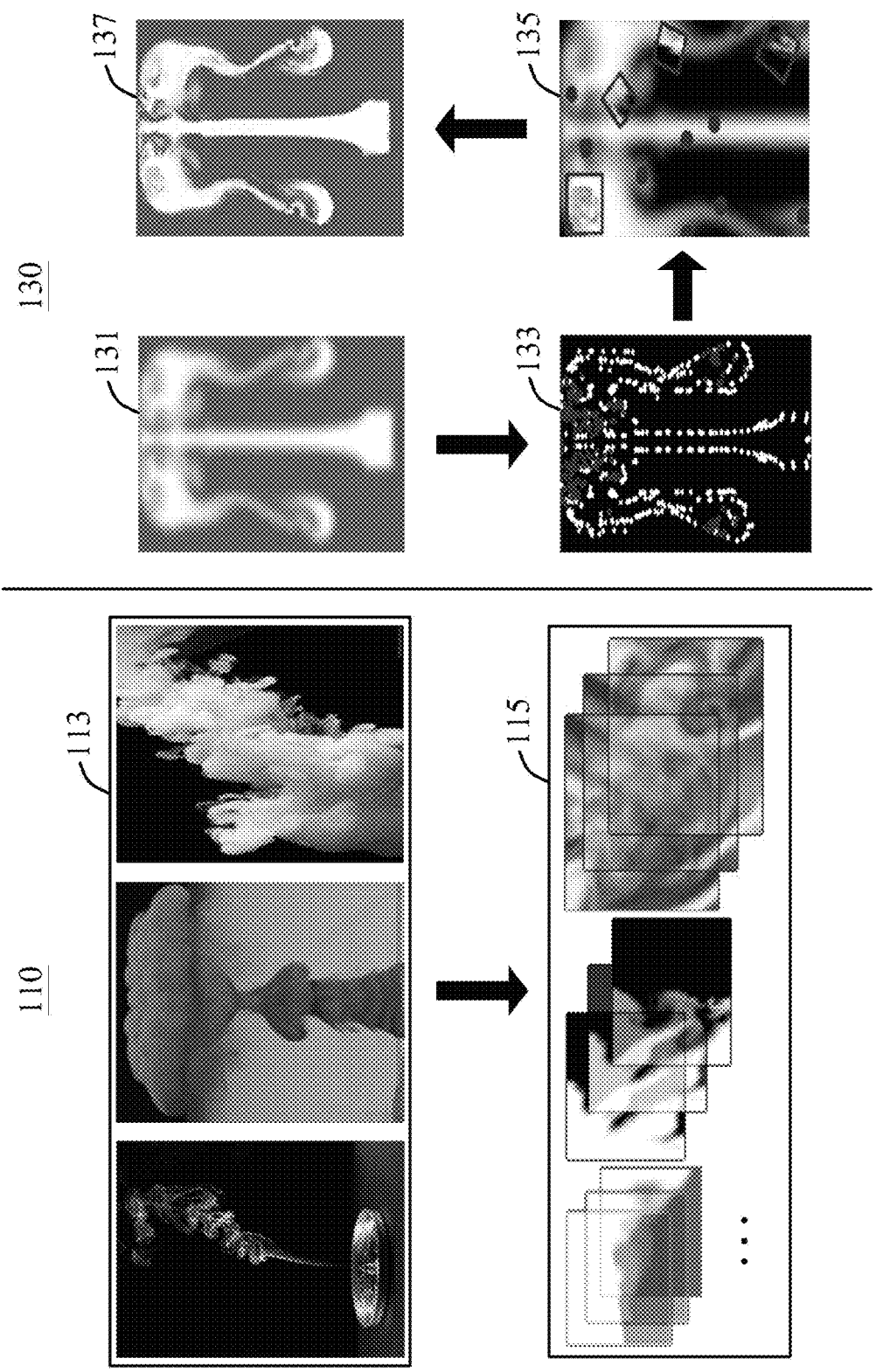
FIG. 1 is a diagram illustrating an example of a method to model smoke turbulence.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, reference will now be made in detail to examples with reference to the accompanying drawings, wherein like reference numerals refer to like elements throughout.

Various alterations and modifications may be made to the examples. Here, the examples are not construed as limited to the disclosure and should be understood to include all changes, equivalents, and replacements within the idea and the technical scope of the disclosure.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

When an element is referred to as being "on," "connected to," "coupled to," or "adjacent to," another element, the element may be directly on, connected to, coupled to, or adjacent to, the other element, or one or more other intervening elements may be present.

Unless otherwise defined, all terms including technical and scientific terms used herein have the same meaning as commonly understood by one of ordinary skill in the art to which examples belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Examples to be described hereinafter may be used to generate a movement of contents through physics-based modeling to generate visual contents. The examples may be embodied in various forms of devices, such as, for example, a personal computer (PC), a laptop computer, a tablet computer, a smartphone, a smart television (TV), a smart home appliance, an intelligent vehicle, and a wearable device. The examples may be used as element technologies of various applications in a game engine, a physical engine, and the like, and embodied as a native code to be used for producing movies, broadcast contents, and the like. In addition, the examples may be used to reproduce visual contents in most hardware including a display device such as, for example, a digital TV (DTV), a smartphone, and a tablet.

Hereinafter, the examples are described in detail with reference to the accompanying drawings. Like reference numerals in the drawings denote like elements, and a known function or configuration will be omitted herein.

FIG. 1 is a diagram illustrating an example of a method to model smoke turbulence. Hereinafter, the method to model smoke turbulence is referred to as smoke turbulence modeling method, and is performed by an apparatus to model smoke turbulence, which is hereinafter referred to as a modeling apparatus. Referring to FIG. 1, the modeling apparatus models smoke turbulence through a precomputation process 110 and a runtime process 130.

The precomputation process 110 is a process to configure a patch library 115 by extracting patches that express, represent, symbolize, illustrate, or indicate various types of smoke or air turbulence from a plurality of high-resolution images 113 obtained by performing, in advance, high-resolution modeling on the types of smoke turbulence.

The precomputation process 110 includes generating, in advance, the patch library 115 including high-resolution patches to be used to model smoke turbulence in the runtime process 130. The patch library 115 includes a plurality of patches expressing, representing, symbolizing, illustrating, or indicating a plurality of types of smoke turbulence extracted from the high-resolution images 113. In fluid dynamics, turbulence or turbulent flow is a flow regime characterized by chaotic property changes. The chaotic property changes include low momentum diffusion, high momentum convection, and rapid variation of pressure and flow velocity in space and time. The types of smoke turbulence include, for example, a smoke generated from a candlelight, a smoke generated by burning firewood, fallen leaves, a smoke generated from a building fire, a cigarette smoke, a smoke generated from an exhaust gas of a vehicle, a smoke generated from a gunfire, and a smoke generated from an explosion. A detailed operation of the precomputation process 110 will be described with reference to FIGS. 2 through 4.

The runtime process 130 is a process to model the smoke turbulence by synthesizing a high-resolution patch retrieved from the patch library 115 generated in the precomputation process 110 to a low-resolution image to be modeled in real time.

The runtime process 130 is illustrated through the images shown in FIG. 1. The runtime process 130 is performed by the modeling apparatus, which is illustrated and described with respect to FIGS. 11 and 12. As shown in stage 131, the runtime process 130, for example, performs low-resolution modeling, at stage 133, detects a turbulent area, at stage 135, synthesizes a patch to a low-resolution image and, at stage 137, and outputs a high-resolution image.

In further detail, in accordance with an embodiment, at stage 131, the modeling apparatus executes the runtime process 130 by performing low-resolution modeling in real time.

In stage 133 in which a turbulent area is detected, the modeling apparatus generates or samples particles in the low-resolution image modeled at stage 131. The modeling apparatus detects the turbulent area, in which smoke turbulence occurs, by moving the generated or the sampled particles along a low-resolution velocity field.

In response to the particles being present in the turbulent area, the modeling apparatus defines a descriptor corresponding to a smoke distribution in the turbulent area. Hereinafter, the descriptor defined to correspond to the smoke distribution in the turbulent area in the runtime process 130, which is performed in real time, will be referred to as a first descriptor, and a descriptor corresponding to a smoke distribution in a patch prestored in the patch library 115 will be referred to as a second descriptor. The second descriptor may be defined to correspond to a location of the patch changed over time. Such descriptors are used for stage 135 to determine a similarity between the low-resolution image and a high-resolution patch in a process of searching for a high-resolution patch matching the turbulent area in the low-resolution image.

In stage 135 in which a patch to the low-resolution image is synthesized, the modeling apparatus searches the patch library 115 for a patch representing high-resolution smoke turbulence that is most suitable for the turbulent area in the low-resolution image, and retrieves the patch from the patch library 115. For example, the modeling apparatus determines a similarity between the first descriptor and second descriptors corresponding to patches, and searches the patch library 115 for a patch corresponding to a second descriptor having a highest similarity. The modeling apparatus synthesizes or combines the retrieved patch and the low-resolution image.

In stage 137 in which a high-resolution image is output, the modeling apparatus outputs, reproduces, or plays a high-resolution smoke turbulence image that is modeled by synthesizing the retrieved patch to the low-resolution image in stage 135. A detailed operation of the runtime process 130 will be described with reference to FIGS. 5 through 9.

Figure 11:
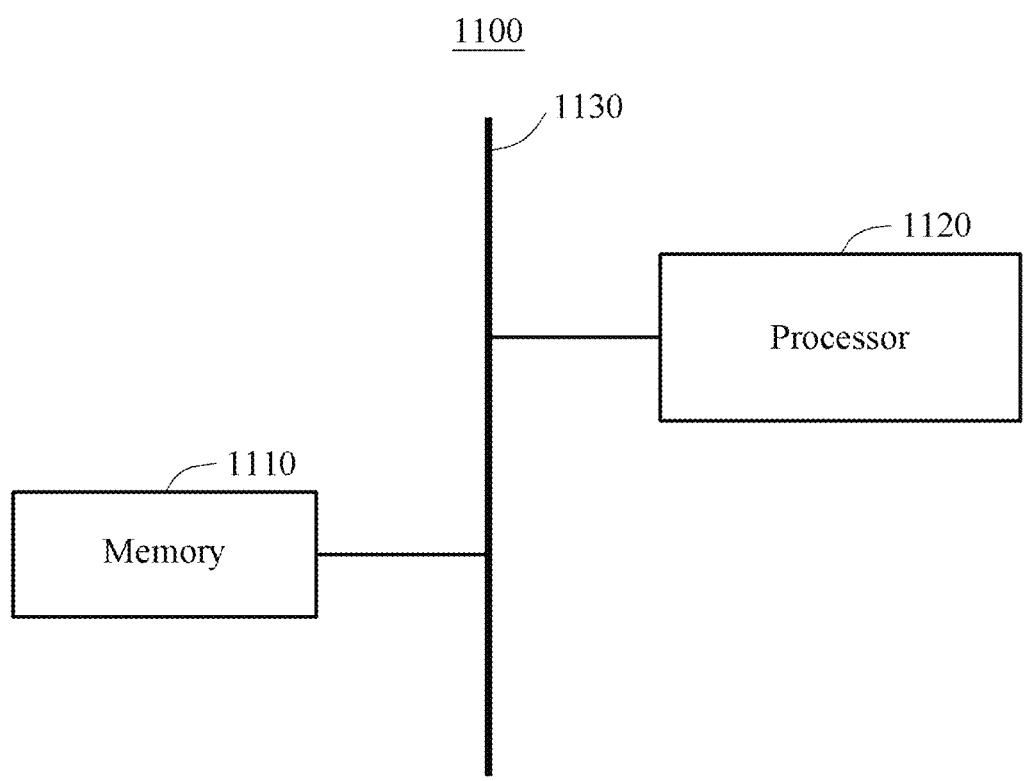
FIGS. 11 and 12 are diagrams illustrating examples of an apparatus to model smoke turbulence.
Figure 12:
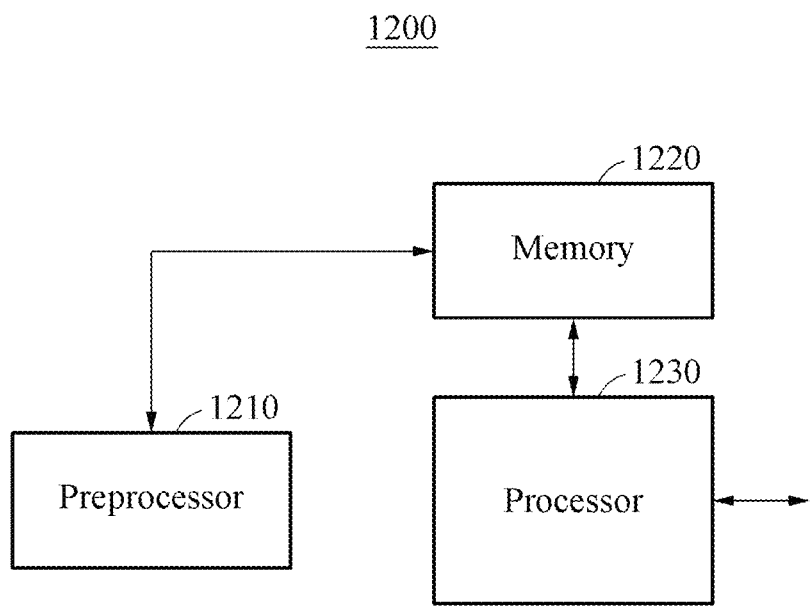

The precomputation process 110 may be performed by a preprocessor or a preprocessor of the modeling apparatus, for example, a preprocessor 1210 of FIG. 12, or performed offline, in advance. The runtime process 130 may be performed by a processor of the modeling apparatus, for example, a processor 1120 of FIG. 11.

The modeling apparatus precomputation apparatus is implemented by hardware components. Examples of hardware components include processors, preprocessors, controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-12. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

As described above, in accordance with an embodiment, high-resolution smoke turbulence may be modeled in real time by tracing a boundary of a smoke distribution in a low-resolution modeling process, matching a patch similar to a shape of the boundary of the smoke distribution, and applying a smoke distribution obtained as a result of the low-resolution modeling process.

Figure 2:
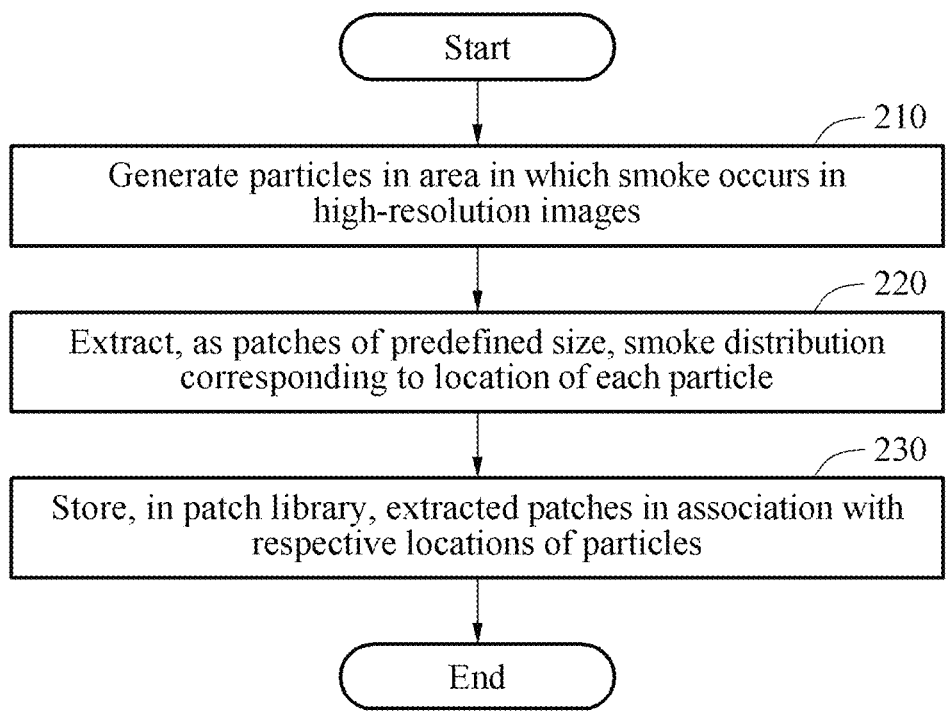
FIG. 2 is a flowchart illustrating an example of a precomputation method to model smoke turbulence.

FIG. 2 is a flowchart illustrating an example of a precomputation method for modeling smoke turbulence. Referring to FIG. 2, in operation 210, a modeling apparatus or a precomputation apparatus generates particles in an area in which a smoke occurs in a plurality of high-resolution images. The modeling apparatus generates or samples traceable particles in the area in which the smoke is generated as a result of various types of high-resolution smoke modeling. The generated particles may have a predefined lifetime.

In operation 220, the modeling apparatus extracts, as patches of a predefined size, a smoke distribution corresponding to a location of each of the particles. The modeling apparatus extracts a smoke distribution at a location of a particle as a patch of a predefined size by moving the particle at a velocity in a modeling space. In this example, the patch includes information about an associated particle(s). For example, the patch has a same lifetime as a lifetime present for the associated particle(s). Thus, in patch synthesis in a runtime process to be subsequently performed, the patch is played for a time length of the lifetime; thus, temporal coherence may be maintained in a result of the modeling.

For example, the modeling apparatus extracts the smoke distribution corresponding to a location of each patch as patches of a predefined size by, for instance, moving the particles in a high-resolution velocity field. The movement of the particles may be a manual movement, triggered by an operator, or an automatic movement, without human intervention.

Figure 3:
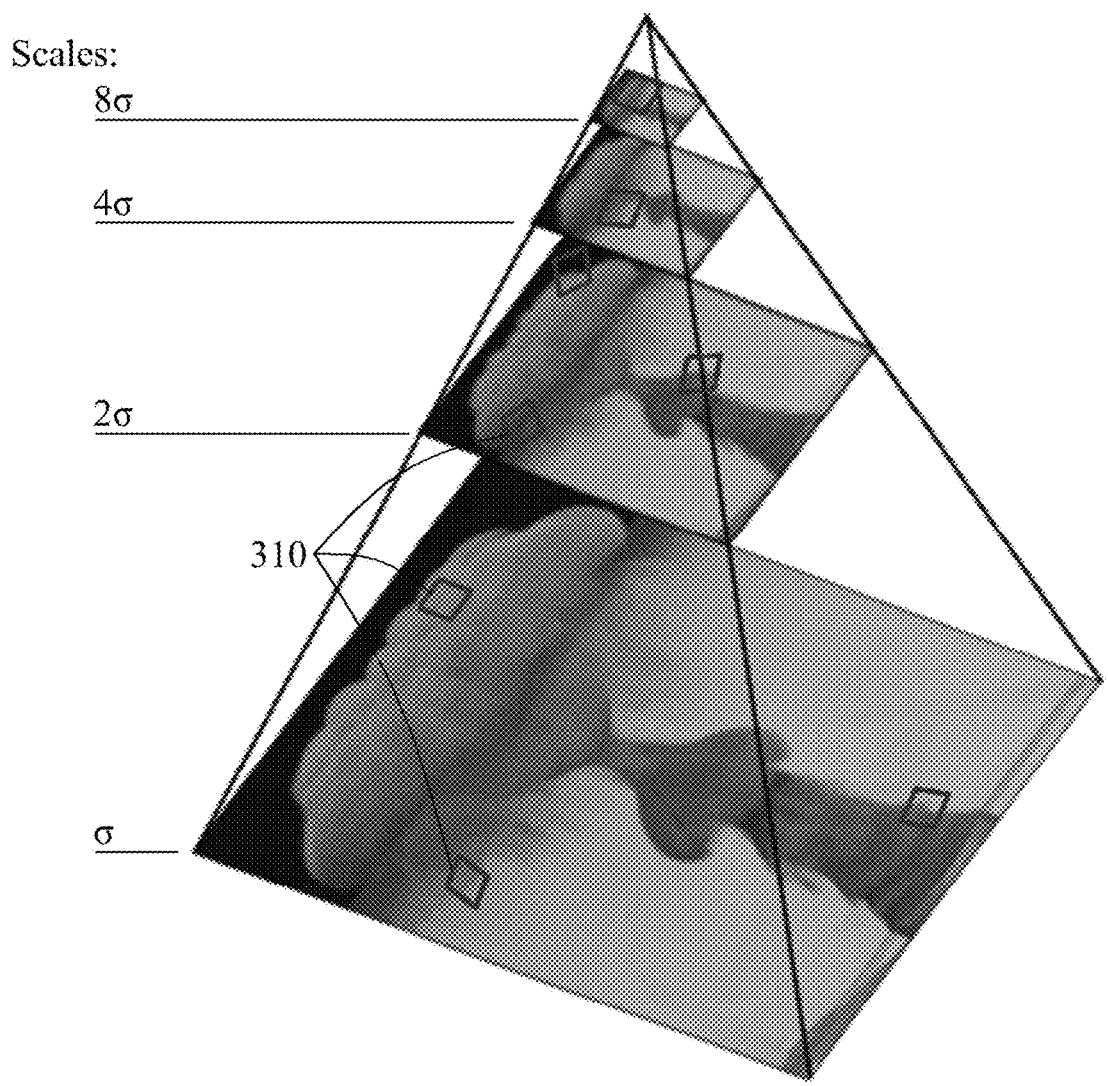
FIGS. 3 and 4 are diagrams illustrating examples of patches.

For example, the modeling apparatus extracts, from variously scaled images in FIG. 3, the smoke distribution corresponding to a location of each particle as the patches with the predefined size. In an embodiment, the modeling apparatus extracts, as the patches with the predefined size, a feature or a feature point of a boundary area of the smoke distribution corresponding to a location of each particle. A detailed description of an extracted patch will be provided with reference to FIG. 4.

In operation 230, the modeling apparatus stores, in a patch library, the extracted patches in association with respective locations of the particles. The patches include a descriptor to be used to determine a similarity between the extracted patches. The patches include a descriptor, for example, a second descriptor, defined to correspond to locations of the particles changed in the smoke distribution. In a few examples, the descriptor may be, for example, a scale-invariant feature transform (SIFT) descriptor, or a speeded-up robust feature (SURF) descriptor. Also, patches having temporal continuity of a same type among the patches are stored in association therewith. For example, when a patch A corresponds to an image two seconds after a cigarette smoke is generated, a patch B corresponds to an image three seconds after the cigarette smoke is generated, and a patch C corresponds to an image four seconds after the cigarette smoke is generated, the patches A, B, and C are stored in a form of, for example, a linked list or a table including temporal continuity information to maintain temporal continuity therebetween.

The patch library includes high-resolution patches representing a movement of particles in a plurality of types of smoke turbulence over time, second descriptors corresponding to the patches, and identifiers (IDs) of the patches.

Figure 4:
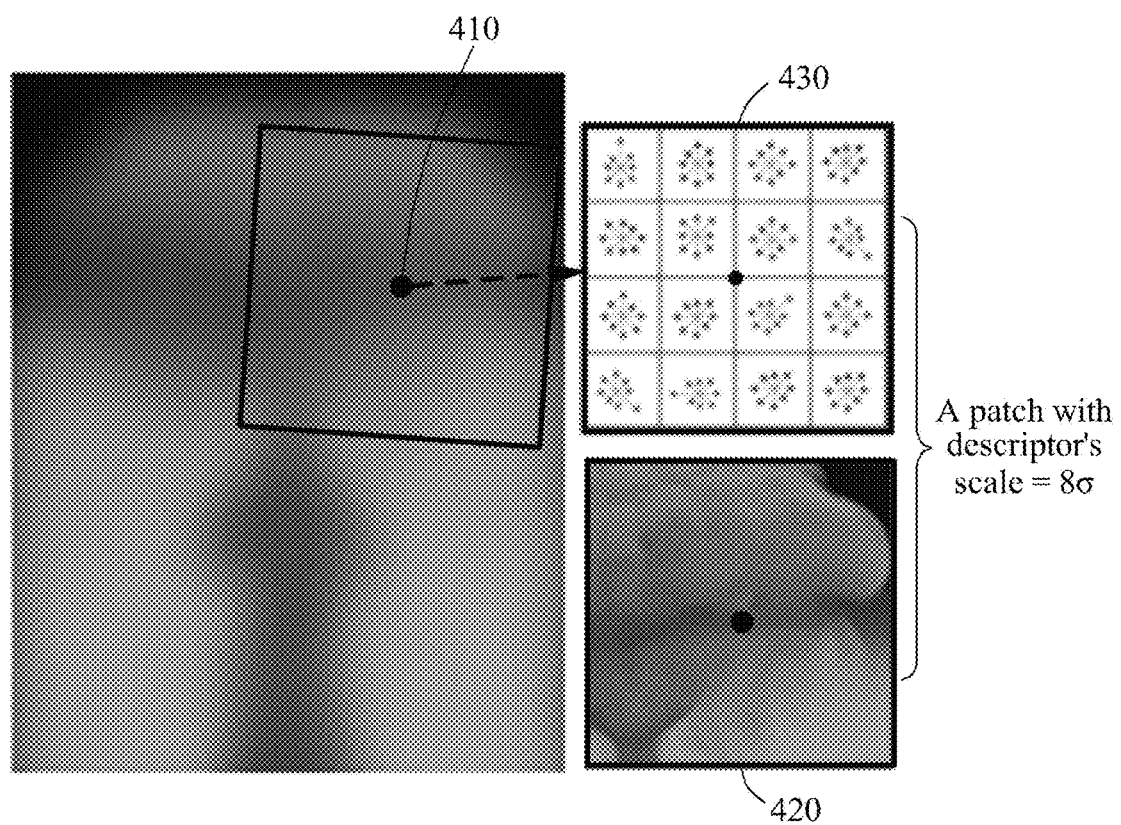

FIGS. 3 and 4 are diagrams illustrating examples of patches. In the example of FIG. 3, images scaled to be various sizes are illustrated.

Referring to FIG. 3, a modeling apparatus extracts, as patches of a predefined size, a feature 310, or a feature point, of a smoke distribution in each of the images scaled to be various sizes, for example, a $\alpha$ scale image, a $2\sigma$ scale image, a $4\sigma$ scale image, and a $8\sigma$ scale image. For example, the modeling apparatus generates, in advance, descriptors for each of the patches of the images, for example, the $\alpha$ scale image, the $2\sigma$ scale image, the $4\sigma$ scale image, and the $8\sigma$ scale image. In accordance with an alternative embodiment, the modeling apparatus generates, in advance, descriptors for a group of patches of the images. The modeling apparatus stores, in a patch library, all the descriptors corresponding to the patches for each scale, and then synthesizes a patch matching a scale of a low-resolution image to the low-resolution image in a patch synthesis process.

The feature or features 310 are detected in a boundary area of the smoke distribution from a Laplacian of Gaussian (LoG) pyramid illustrated in FIG. 3.

The LoG pyramid includes a feature of a boundary area extracted by an LoG operator from each of images scaled to be various sizes. The LoG operator, which is configured to detect an edge, for example, a boundary area of an object included in an image, extracts edges in all directions. The boundary area includes information used to determine a shape, an orientation, and other information pertaining to the boundary area of the object. A description of patches reflecting a feature of the boundary area in a smoke distribution will be provided with reference to FIG. 4.

In the example of FIG. 4, a patch 420 extracted from a smoke distribution in the $8\sigma$ scale image of FIG. 3, and second descriptors 430 corresponding to the patch 420 are illustrated.

Referring to FIG. 4, the modeling apparatus generates a particle 410 in an area in which a smoke is generated in the $8\sigma$ scale high-resolution image, and extracts, as the patch 420 of a predefined size, a smoke distribution corresponding to a location of the generated particle 410. In an illustrative example, the modeling apparatus generates a particle(s) in neighboring areas including the area in which the smoke is generated in the high-resolution image.

The modeling apparatus extracts, as the patch 420 of the predefined size, the smoke distribution corresponding to the location of the particle 410 by manually moving the particle 410 in a high-resolution velocity field. The patch 420 including descriptors, for example, the second descriptors 430 defined to correspond to changed locations of the particle 410 in the smoke distribution. For example, the modeling apparatus divides the patch 420 into 4*4 subareas, and divides each of the subareas into eight gradients. The second descriptors 430 includes magnitudes and orientations.

For example, the modeling apparatus obtains an overall orientation indicated by pixels by obtaining a gradient for an area adjacent to a feature or a feature point of patches. The modeling apparatus rotates the patches for a gradient orientation of the patches to be 0°. The modeling apparatus stores, in a patch library or a database, second descriptors, for example, SIFT descriptors, with respect to the rotated patches. Thus, although an object, for example, a smoke distribution, in a low-resolution image to be subsequently modeled is rotated at 90°, the modeling apparatus may synthesize a patch to the low-resolution image by adjusting an orientation of the patch.

Figure 5:
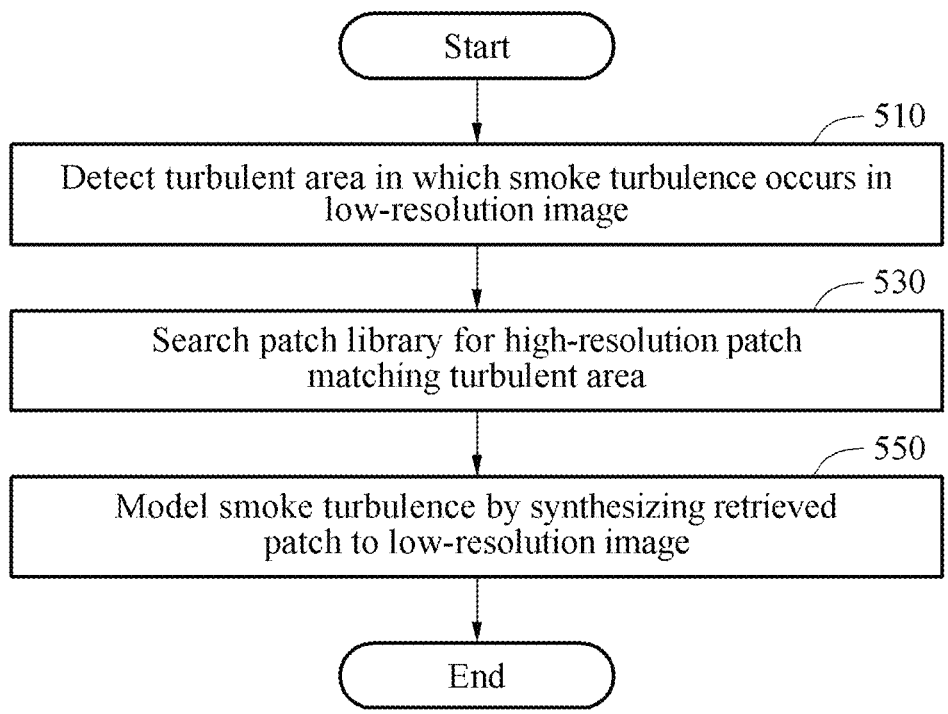
FIG. 5 is a flowchart illustrating an example of a method to model smoke turbulence.

FIG. 5 is a flowchart illustrating an example of a smoke turbulence modeling method. Referring to FIG. 5, in operation 510, a modeling apparatus detects a turbulent area in which smoke turbulence occurs in a low-resolution image. The turbulent area is construed as an area in which occurrence of smoke turbulence is to be expressed.

In operation 510, the modeling apparatus generates particles traceable in a low-resolution velocity field that is a modeling space. The modeling apparatus detects the turbulent area in the low-resolution image based on a movement of the particles. The modeling apparatus detects a boundary area from a smoke distribution in the low-resolution image by tracing the movement of the particles. In an example, a boundary area excluding an inner portion of the smoke distribution is detected as the turbulent area.

In an example, the traceable particles are particles indicating an area to which a patch is to be synthesized. In addition, the detected turbulent area corresponds to a candidate area for the synthesizing. A process of detecting a turbulent area by the modeling apparatus will be described with reference to FIGS. 6 and 7.

In operation 530, the modeling apparatus searches a patch library for a high-resolution patch matching the turbulent area. The patch library includes patches representing smoke turbulence extracted from high-resolution images. The modeling apparatus searches the patch library for the patch representing a smoke distribution similar to a smoke distribution in the turbulent area.

For example, the modeling apparatus searches the patch library for patches matching a first descriptor corresponding to locations of particles present in the boundary area of the smoke distribution of the low-resolution image. The locations of the particles changes over time. The patches matching the first descriptor are construed as patches corresponding to second descriptors similar to the first descriptor. A process of searching for a high-resolution patch matching a turbulent area by the modeling apparatus will be described with reference to FIG. 8.

In operation 550, the modeling apparatus models smoke turbulence by synthesizing the retrieved patch to the low-resolution image. A physical quantity differs between the turbulent area in the low-resolution image and the retrieved patch. The modeling apparatus synthesizes the patch retrieved in operation 530 to the low-resolution image by adjusting a density scale of the retrieved patch based on a physical quantity of a smoke in the turbulent area, for example, a smoke density, mass, and volume. In addition, the modeling apparatus synthesizes the retrieved patch to the low-resolution image by adjusting an orientation of the retrieved patch to be suitable to a moving direction of the particles in the low-resolution image.

The modeling apparatus fades the patch during an initial synthesis so that the patch is synthesized to be visually continuous. When the modeling apparatus succeeds in initial matching, the modeling apparatus continuously performs patch matching and synthesis using patches having temporal continuity with the synthesized patch in the patch library.

Figure 6:
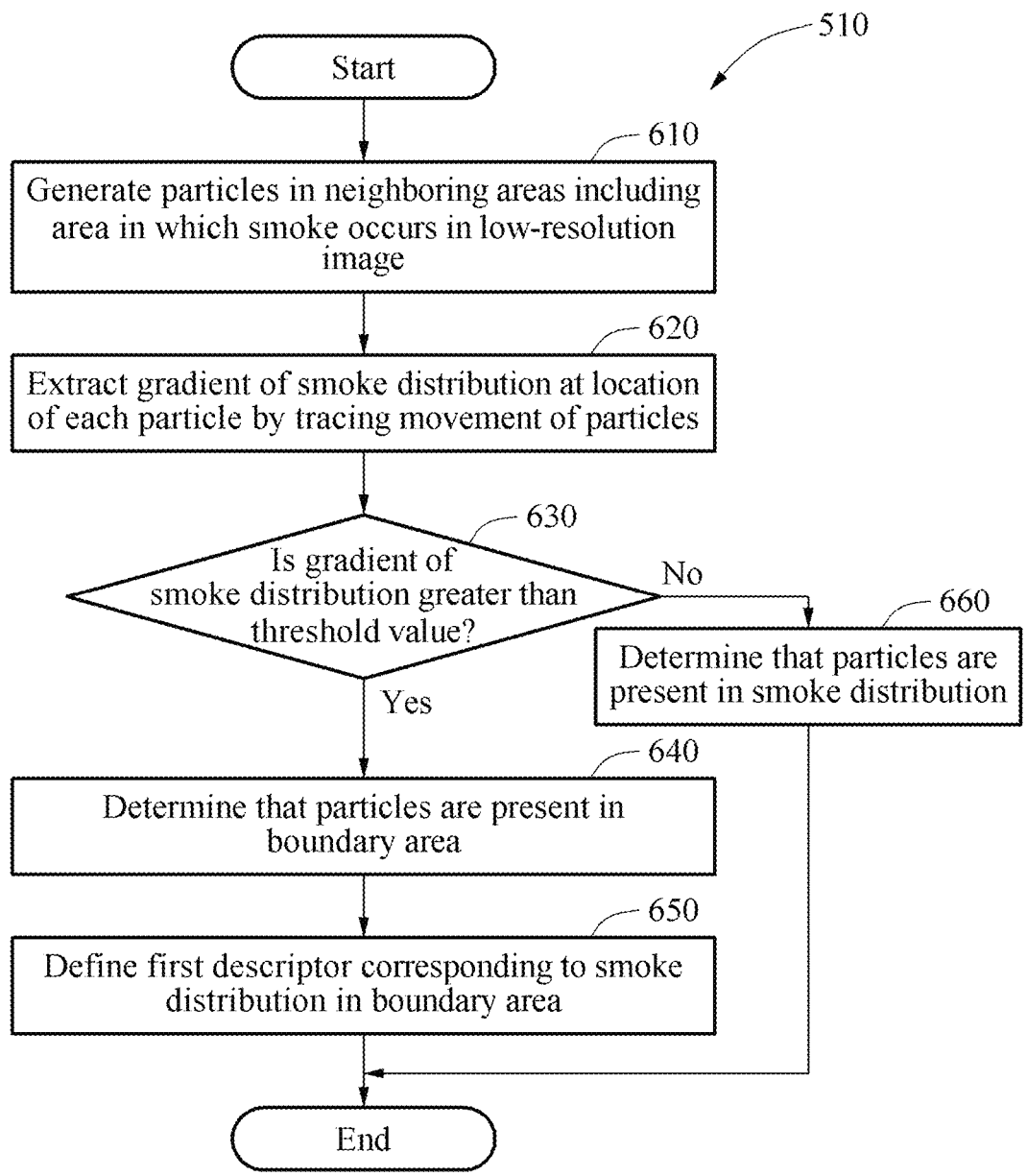
FIG. 6 is a flowchart illustrating an example of a process to detect a turbulent area.

FIG. 6 is a flowchart illustrating an example of a process to detect a turbulent area, as shown in FIG. 5, operation 510. Referring to FIG. 6, in operation 610, a modeling apparatus generates particles in neighboring areas including an area in which a smoke occurs in a low-resolution image.

In operation 620, the modeling apparatus extracts a gradient of a smoke distribution at a location of each of the particles by tracing a movement of the particles in the low-resolution image. The modeling apparatus extracts the gradient of the smoke distribution at a location of each particle by extracting a gradient of neighboring particles corresponding to each of the particles.

In operation 630, the modeling apparatus compares the gradient of the smoke distribution to a threshold value. In operation 660, in response to the gradient of the smoke distribution being less than or equal to the threshold value, as a result of the comparing in operation 630, the modeling apparatus determines that the particles are present in the smoke distribution, and terminates the process of detecting a turbulent area.

In operation 640, in response to the gradient of the smoke distribution being greater than the threshold value, as the result of the comparing in operation 630, the modeling apparatus determines that the particles are present in a boundary area of the smoke distribution. In response to the particles being determined to be present in the boundary area, the modeling apparatus detects the boundary area as a turbulent area in which smoke turbulence occurs. The boundary area is, for example, a density boundary area of the smoke distribution.

In operation 650, the modeling apparatus defines a first descriptor corresponding to the smoke distribution in the boundary area.

Figure 7:
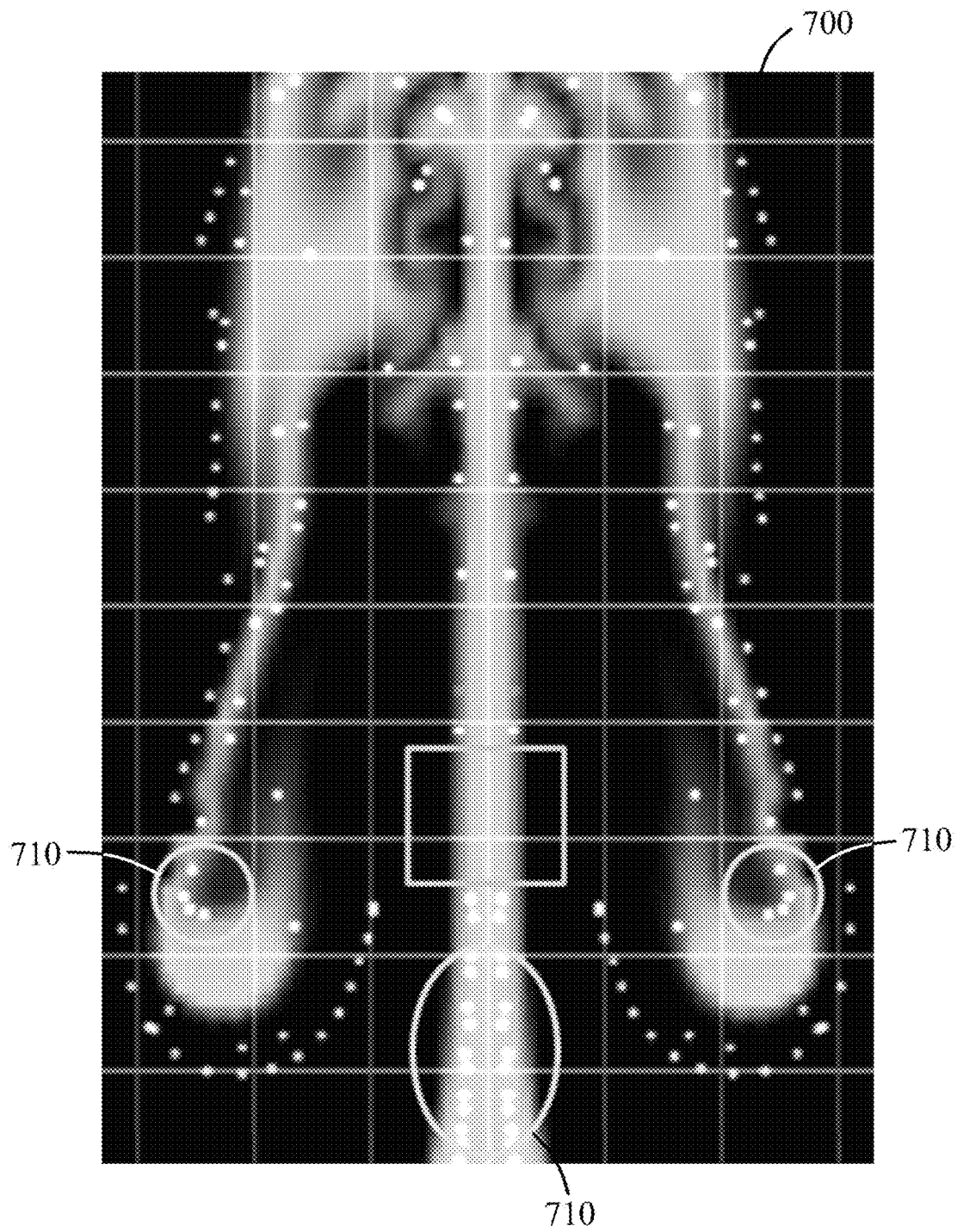
FIG. 7 is a diagram illustrating an example of a process to detect a turbulent area.

FIG. 7 is a diagram illustrating an example of a process to detect a turbulent area. In the example of FIG. 7, particles 710 generated, or sampled, in neighboring areas including an area in which a smoke is generated in a low-resolution image 700 are illustrated.

Referring to FIG. 7, as in a precomputation process, a modeling apparatus generates the particles 710 in the neighboring areas, including the area in which a smoke is generated in the low-resolution image 700, in a runtime process. In an embodiment, the particles 710 are particles indicating an area to which a patch is synthesized.

The modeling apparatus extracts a gradient of a smoke or gas distribution, at a location of each of the particles 710 by manually moving the particles 710 in a low-resolution modeling space. When the gradient has a value greater than or equal to a threshold value, the modeling apparatus determines that the particles 710 are on a boundary of the smoke distribution. In an example, a boundary area of the smoke distribution is a candidate patch for synthesis. The modeling apparatus defines a first descriptor, for example, an SIFT descriptor, by extracting a smoke distribution in the boundary area.

Figure 8:
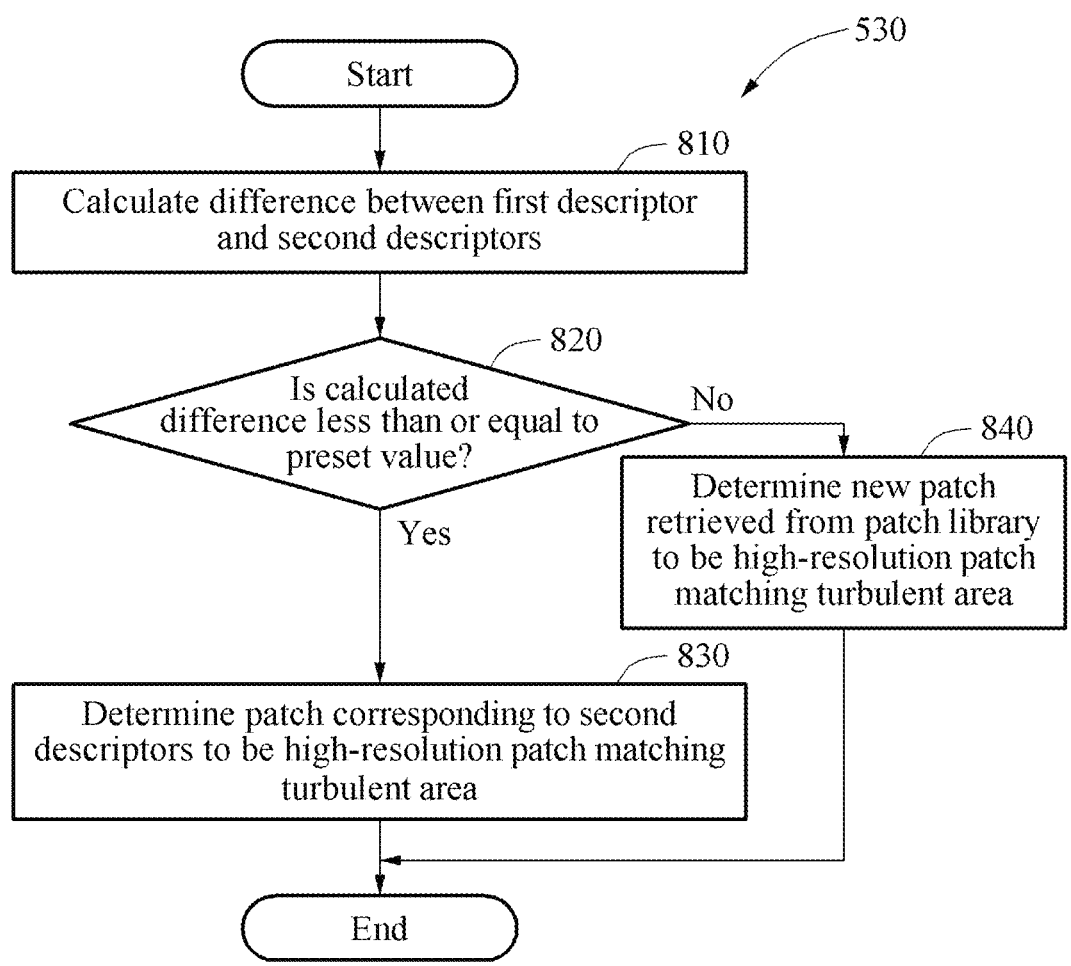
FIG. 8 is a flowchart illustrating an example of a process to search for a high-resolution patch.

FIG. 8 is a flowchart illustrating an example of a process to search for a high-resolution patch, as shown in FIG. 5, operation 530. Referring to FIG. 8, in operation 810, a modeling apparatus calculates a difference between a first descriptor and second descriptors. For example, the difference between the first descriptor and the second descriptors is defined as a difference between the descriptors such as, for example, a Euclidean distance. The second descriptors may include descriptors corresponding to retrieved patches and descriptors having temporal continuity with other second descriptors. The first descriptor may correspond to a changed location of particles.

In operation 820, the modeling apparatus compares the difference calculated in operation 810 to a preset value. In operation 830, in response to the difference being less than or equal to the preset value, as a result of the comparing in operation 820, the modeling apparatus determines a patch corresponding to the second descriptors to be a high-resolution patch matching a turbulent area.

In operation 840, in response to the difference being greater than the preset value, as the result of the comparing in operation 820, the modeling apparatus determines a new patch retrieved from a patch library to be the high-resolution patch matching the turbulent area.

Figure 9:
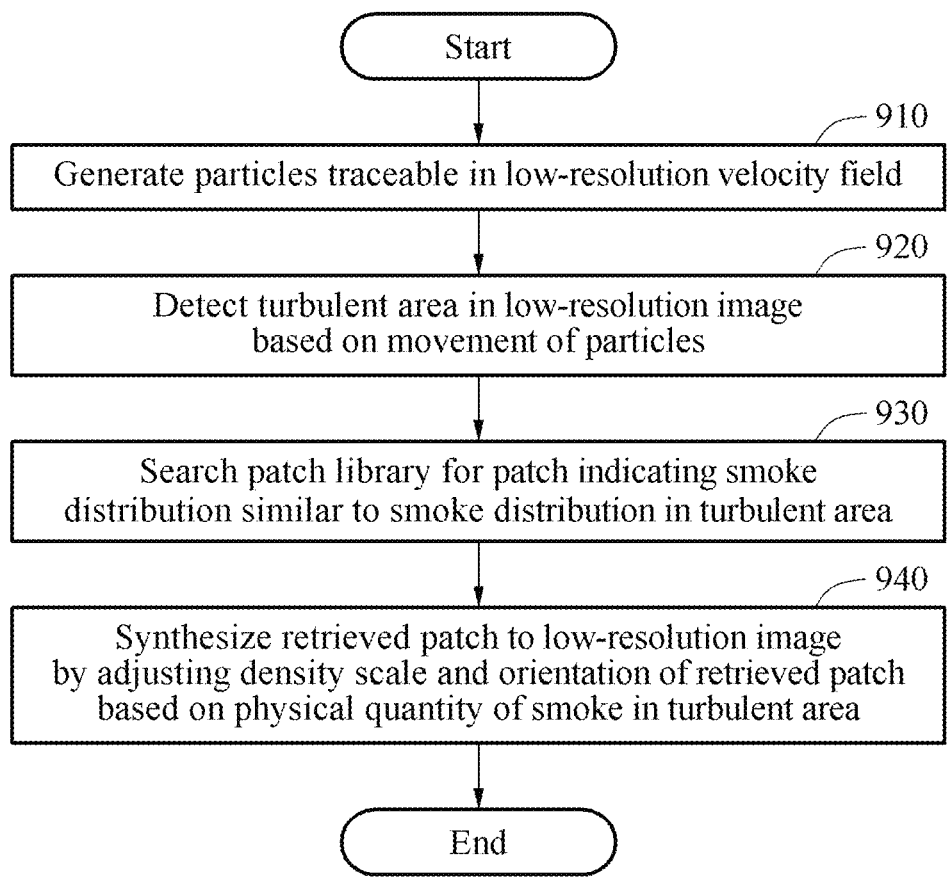
FIG. 9 is a flowchart illustrating another example of a method to model smoke turbulence.

FIG. 9 is a flowchart illustrating another example of a smoke turbulence modeling method. Referring to FIG. 9, in operation 910, a modeling apparatus generates particles traceable in a low-resolution velocity field.

In operation 920, the modeling apparatus detects a turbulent area in a low-resolution image based on a movement of the particles.

In operation 930, the modeling apparatus searches a patch library for a patch indicating a smoke distribution similar to a smoke distribution of the turbulent area.

In operation 940, the modeling apparatus synthesizes the retrieved patch to the low-resolution image by adjusting a density scale and an orientation of the retrieved patch. The adjustment is based on a physical quantity of a smoke in the turbulent area, for example, a smoke density, mass, and volume.

Figure 10:
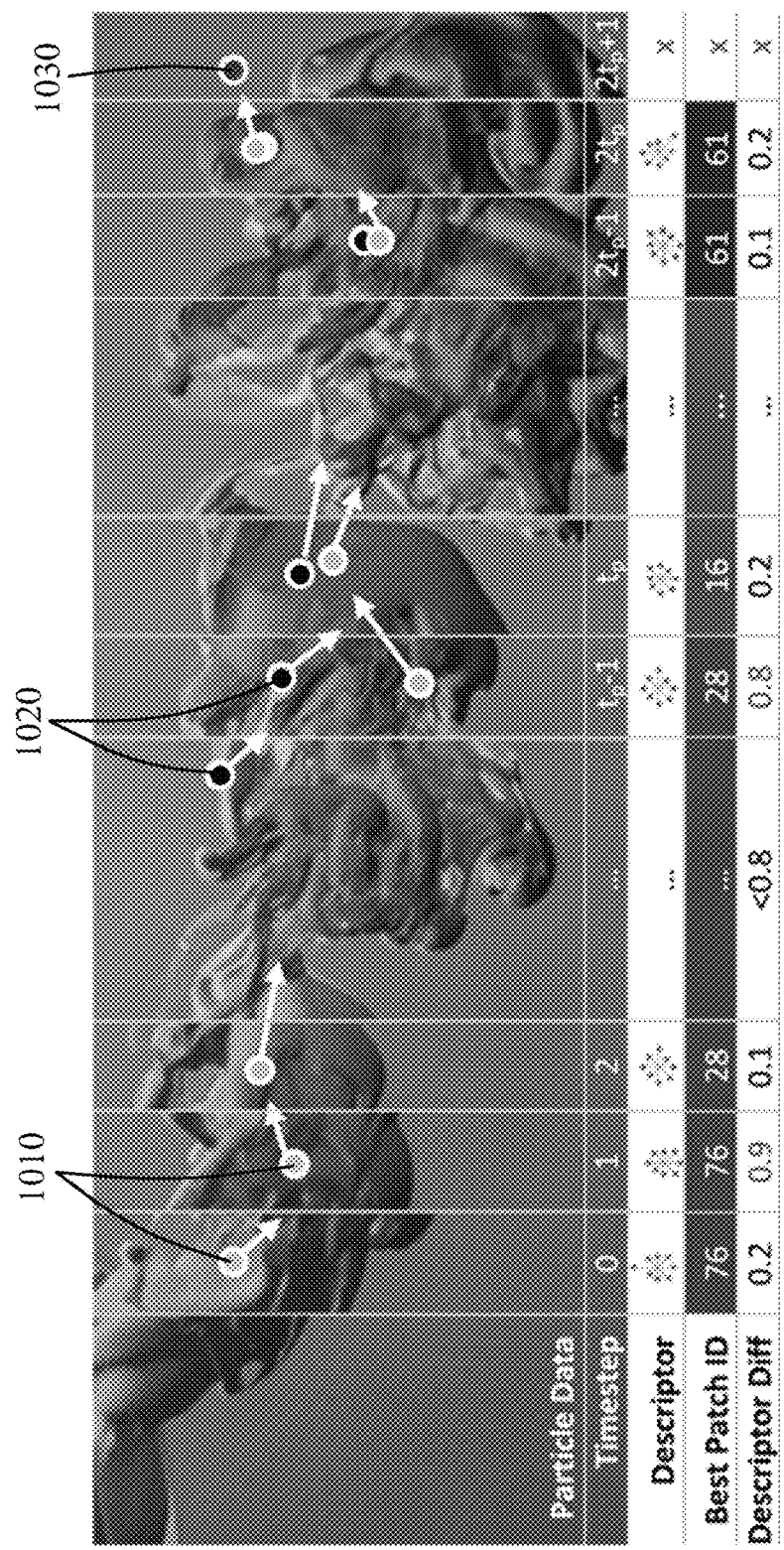
FIG. 10 is a diagram illustrating an example of a method to model smoke turbulence using a patch library.

FIG. 10 is a diagram illustrating an example of a smoke turbulence modeling method using a patch library. In the example of FIG. 10, smoke turbulence is modeled in real time during modeling being performed in a low-resolution image.

Referring to FIG. 10, during the modeling performed in the low-resolution image, a modeling apparatus searches the patch library for a patch similar to a first descriptor, which corresponds to a location of a particle 1010 traceable in a timestep 0 of the low-resolution image.

The modeling apparatus searches the patch library for a patch corresponding to a second descriptor similar to the first descriptor. In accordance with an embodiment, the second descriptor that is similar to the first descriptor is construed as a second descriptor having a shortest Euclidean distance from the first descriptor.

For example, a patch having an ID 76, among patches stored in the patch library, corresponds to the second descriptor most similar to the first descriptor because a difference between the descriptors is 0.2.

In such an example, the modeling apparatus searches for the patch having the ID 76. In a pre-calculation process, the patch having the ID 76 is stored in association with patches having temporal continuity, for example, time-series patches. The patches having temporal continuity with the patch having the ID 76 have a same ID, for example, ID 76, or a different ID, for example, ID 76-1 and ID 76-2, . . . , or ID 76, ID, 77, and ID 78.

The modeling apparatus determines whether a difference between the first descriptor and descriptors, for example, the second descriptors, of the patches having the temporal continuity with the patch having the ID 76 exceeds a threshold value, for example, 0.8. In response to the difference not exceeding the threshold value, the modeling apparatus models smoke turbulence by continuously synthesizing the patches having the temporal continuity to a turbulent area in the low-resolution image.

For example, when the difference between the descriptors exceeds 0.8, as shown in a timestep 1 or a timestep $t_p-1$, the modeling apparatus searches the patch library for a second descriptor or a patch corresponding to the second descriptor, which corresponds to the first descriptor associated with a changed location of a particle in a corresponding timestep. For example, in the timestep $t_p-1$, the modeling apparatus searches for a new patch having an ID 16, and synthesizes the patch having the ID 16 to the turbulent area in the low-resolution image.

When synthesis is performed for turbulent area corresponding to at least two particles in the low-resolution image, high-resolution patches retrieved from the patch library may overlap. In such a case, to prevent a visible artifact, such as an overlap density value and a shape blur due to the overlapping, the modeling apparatus only selects a patch having a highest similarity among the overlapping patches and synthesizes the selected patch to the turbulent area.

As described above, the modeling apparatus searches the patch library for a patch similar to a first descriptor corresponding to a location of a remaining particle, for example, a particle 1020 and a particle 1030.

In an example, the modeling apparatus generates the particle 1010, and moves the particle 1010 towards a boundary area of a smoke distribution using Equation 1 below, when moving the particle 1010 in a modeling velocity field.

$$C_i = \frac{\sum_j \|\nabla den_j\| j}{\sum_j \|\nabla den_j\|} \qquad \text{[Equation 1]}$$

In Equation 1, "$C_i$" denotes a correction term to correct a motion direction of a particle, and "$\Lambda den_j$" denotes a density gradient at a location of the particle in which the subscript "$j$" denotes an index of the particle.

That is, in response to the generated particle 1010 moving at a velocity in the velocity field of the modeling space, the modeling apparatus corrects a moving direction of the particle 1010 by the correction term in Equation 1 to allow the particle 1010 to move along a boundary area of a smoke distribution.

In addition, when scaling a smoke distribution of a patch, the modeling apparatus allows a density of the patch to be equal to a density of a turbulent area in a low-resolution image using Equation 2 below.

$$\rho(\hat{P}, x) = \rho(P, x) \frac{\sum_x \rho(T, x)}{\sum_x \rho(P, x)} \quad \text{[Equation 2]}$$

$$\rho(\hat{P}, x) = [\rho(P, x) - \rho_{min}(P)] \frac{\rho_{max}(T) - \rho_{min}(T)}{\rho_{max}(P) - \rho_{min}(P)} + \rho_{min}(T)$$

In Equation 2, "$\rho(\hat{P},x)$" denotes a density of a smoke distribution corresponding to a location of a particle x in a corrected patch $\hat{P}$, and "$\rho(P,x)$" denotes a density of a smoke distribution corresponding to a location of a patch P. "$\rho(T, x)$" denotes a density of a smoke distribution corresponding to a location of the particle x in a turbulent area T, in a low-resolution image. A first part of Equation 2 indicates a process of rescaling a density at each location of a high-resolution patch to allow a total sum of densities of the high-resolution patch to be equal to a total sum of densities of the turbulent area in the low-resolution image.

"$\rho min(P)$" and "$\rho max(P)$" denotes a minimum density value and a maximum density value, respectively, of a smoke distribution corresponding to a location of the particle x in the patch. "$\rho max(T)$" and "$\rho min(T)$" denotes a maximum density value and a minimum density value, respectively, of a smoke distribution corresponding to a location of the particle x in the turbulent area in the low-resolution image.

A second part of Equation 2 indicates a process of rescaling a density at each location of a high-resolution patch by matching the minimum density value of the high-resolution patch to the minimum density value of the turbulent area in the low-resolution image. Also, the process of the second part of Equation 2 allows a change in an adjacent density value of the high-resolution patch to follow a change in an adjacent density value of the turbulent area in the low-resolution image.

Thus, in accordance with at least some of the many advantages of the present modeling apparatus and method performed therein, the modeling apparatus matches a total sum of densities and a change in an adjacent density value between the high-resolution patch and the turbulent area in the low-resolution image.

FIG. 11 is a diagram illustrating an example of a modeling apparatus 1100, in accordance with an embodiment.

Referring to FIG. 11, the modeling apparatus 1100 includes a memory 1110 and a processor 1120. The memory 1110 and the processor 1120 may communicate with each other through a bus 1130 or may communicate wirelessly. Furthermore, although a single memory 1110 is illustrated, a person of ordinary skill in the art will appreciate that one or more memories may be included within the memory 1110 to perform the various storing operations described herein. Furthermore, although a single structural processor 1120 is illustrated in FIG. 11, a person of ordinary skill in the art will appreciate that more than one processor may be included within the processor 1120 to perform the detection, the generation, the extraction, the comparison, the defining, the searching, the calculation, and the determination described below. For instance, one or more processors within the processor 1120 may be configured as a structural detector, generator, extractor, comparator, defining processor, searching processor, calculator, and determiner. Also, although the memory 1110 and the processor 1120 are illustrated to be separate from each other, in an alternative embodiment, the memory 1110 and the processor 1120 may be integrated as a single structural device.

The memory 1110 stores a patch library including patches representing smoke turbulence extracted from high-resolution images. The memory 1110 may be a volatile or a nonvolatile memory.

The processor 1120 detects a turbulent area in which smoke turbulence is generated in a low-resolution image. The processor 1120 models the smoke turbulence by synthesizing, to the low-resolution image, a high-resolution patch retrieved from the patch library and matching the turbulent area.

The processor 1120 generates particles in neighboring areas including an area in which a smoke is generated in the low-resolution image. The processor 1120 detects a boundary area of a smoke distribution in the low-resolution image by tracing a movement of the particles.

The processor 1120 extracts a gradient of a smoke distribution at a location of each of the particles. The processor 1120 compares the gradient of the smoke distribution to a threshold value. The processor 1120 defines a first descriptor corresponding to a smoke distribution in the boundary area by determining whether the particles are present in the boundary area based on a result of the comparing.

The processor 1120 searches the patch library for patches matching second descriptors corresponding to locations of the particles in the boundary area that are changed over time.

The processor 1120 calculates a difference between second descriptors corresponding to the retrieved patches and including second descriptors having temporal continuity with the second descriptors, and the first descriptor corresponding to the second descriptors corresponding to the changed locations of the particles. The processor 1120 determines, to be the high-resolution patch matching the turbulent area, a patch corresponding to the second descriptors or a new patch retrieved from the patch library based on a result of comparing the calculated difference to a preset value.

In addition, the processor 1120 may perform at least one operation described with reference FIGS. 1 through 10.

The processor 1120 executes an application program, and controls the modeling apparatus 1100. A program code to be executed by the processor 1120 is stored in the memory 1110. The modeling apparatus 1100 is wirelessly or through a bus connected to an external device, for example, a personal computer (PC) and a network, through an input or output device (not shown), and exchange data therebetween.

The modeling apparatus 1100 may be embedded in various digital devices, for example, a mobile device and a smart television (TV), or interwork with such various digital devices to provide, in real time, more realistic smoke or gas turbulence modeling in image applications.

According to an example, a modeling apparatus described herein may include a preprocessor and the modeling apparatus including the preprocessor will be described with reference to FIG. 12.

FIG. 12 is a diagram illustrating another example of a modeling apparatus 1200. Referring to FIG. 12, the modeling apparatus 1200 includes a preprocessor 1210, a memory 1220, and a processor 1230. Similar to FIG. 11, although a single structural preprocessor 1210 is illustrated in FIG. 12, a person of ordinary skill in the art will appreciate that more than one processor may be included within the processor 1210 to perform functions described below. The memory 1220 and the processor 1230 may be structurally arranged as described in FIG. 11.

The preprocessor 1210 generates particles in an area in which a smoke is generated in a plurality of high-resolution images, and extracts a smoke distribution corresponding to a location of each of the particles as patches of a predefined size. The preprocessor 1210 stores, in a patch library, the extracted patches in association with respective locations of the particles.

The preprocessor 1210 extracts the smoke distribution corresponding to the respective locations of the particles as the patches of the predefined size by manually or automatically moving the particles in a high-resolution velocity field.

The preprocessor 1210 extracts, as the patches of the predefined size, a feature or a feature point of a boundary area of the smoke distribution corresponding to the respective locations of the particles. The extracted patches may have a lifetime equal to a lifetime preset for the particles.

The memory 1220 stores the patch library generated by the preprocessor 1210. The patch library may include patches representing smoke turbulence extracted from the high-resolution images. The patch library may also include second descriptors corresponding to the patches and IDs of the patches. The patches may be high-resolution patches representing a movement of particles in various types of smoke turbulence based on time. The patches may be stored in association with respective locations of the particles, and patches having temporal continuity among the patches may be stored in association therewith.

For other operations of the memory 1220 and the processor 1230, reference may be made to the description of the memory 1110 and the processor 1120 provided with reference to FIG. 11.

The apparatuses, memories, processors, devices, and other components illustrated in FIGS. 11 and 12 that perform the operations described herein with respect to FIGS. 2, 5, 6, 8 and 9 are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 2, 5, 6, 8 and 9. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of modeling smoke turbulence, comprising:
   detecting a turbulent area comprising smoke turbulence in a low-resolution image;
   searching for and retrieving a high-resolution patch matching the turbulent area in a memory that comprises high-resolution patches representing smoke turbulence extracted from high-resolution images; and
   modeling the smoke turbulence by synthesizing the retrieved patch to the low-resolution image.

2. The method of claim 1, wherein the memory comprises a patch library comprising high-resolution patches representing types of smoke turbulence extracted from the high-resolution images, and the searching includes searching the patch library.

3. The method of claim 2, wherein the patch library comprises patches stored in association with respective locations of particles, patches temporally continuous with each other and stored in association with each other, and any one or any combination of any two or more of high-resolution patches representing a movement of particles in types of smoke turbulence over time, second descriptors, and identifiers.

4. The method of claim 1, wherein the detecting of the turbulent area comprises
   generating particles traceable in a low-resolution velocity field, and
   detecting the turbulent area in the low-resolution image based on a movement of the particles.

5. The method of claim 4, wherein
   the generating of the particles comprises generating the particles in neighboring areas comprising an area in which a-smoke occurs in the low-resolution image, and
   the detecting of the turbulent area comprises detecting a boundary area from a smoke distribution in the low-resolution image by tracing the movement of the particles.

6. The method of claim 5, wherein the detecting of the boundary area comprises
   extracting a gradient of a smoke distribution at a location of each of the particles, and
   determining whether the particles are present in the boundary area based on a result of comparing the gradient of the smoke distribution to a threshold value.

7. The method of claim 6, further comprising:
   in response to presence of the particles in the boundary area, defining a first descriptor to correspond to a smoke distribution in the boundary area.

8. The method of claim 7, wherein the searching for and retrieving of the high-resolution patch comprises searching for and retrieving, from the memory, patches matching second descriptors corresponding to locations of the particles in the boundary area that changed over time.

9. The method of claim 8, wherein the searching for and retrieving of the high-resolution patch comprises
   calculating a difference between the second descriptors, which comprise descriptors corresponding to the retrieved patches and descriptors having temporal continuity with other descriptors, and the first descriptor which corresponds to the second descriptors,
   in response to the calculated difference being less than or equal to a preset value, determining a patch corresponding to descriptors having temporal continuity with the descriptors corresponding to the retrieved patches to be the high-resolution patch matching the turbulent area, and
   in response to the calculated difference being greater than the preset value, determining a new patch retrieved from the memory to be the high-resolution patch matching the turbulent area.

10. The method of claim 9, wherein the difference between the first descriptor and the second descriptors is based on a Euclidean distance between the first descriptor and the second descriptors.

11. The method of claim 1, wherein the searching for and retrieving of the high-resolution patch comprises searching the memory for a patch indicating a smoke distribution similar to a smoke distribution in the turbulent area.

12. The method of claim 1, wherein the modeling of the smoke turbulence comprises synthesizing the retrieved patch to the low-resolution image by adjusting a density scale and an orientation of the retrieved patch based on a physical quantity of a-smoke in the turbulent area.

13. The method of claim 1, wherein the searching for and retrieving of the high-resolution patch comprises
   calculating a difference between a first descriptor corresponding to a changed location of particles and second descriptors corresponding to at least one retrieved patch and having temporal continuity,
   in response to the difference being less than or equal to a preset value, determining a patch corresponding to the second descriptors to be a high-resolution patch matching a turbulent area, and
   in response to the difference being greater than the preset value, determining a new patch retrieved from a patch library to be the high-resolution patch matching the turbulent area.

14. An apparatus for modeling smoke turbulence, comprising:
   a memory configured to store patches representing smoke turbulence extracted from high-resolution images; and
   a processor configured to detect a turbulent area of a low-resolution image in which smoke turbulence occurs, and model the smoke turbulence by synthesizing, to the low-resolution image, a high-resolution patch retrieved from the memory and matching the turbulent area.

15. The apparatus of claim 14, wherein the processor is configured to generate particles in neighboring areas comprising an area in which a smoke occurs in the low-resolution image, and detect a boundary area from a smoke distribution in the low-resolution image by tracing a movement of the particles.

16. The apparatus of claim 15, wherein the processor is configured to extract a gradient of the smoke distribution at a location of each of the particles, and define a first descriptor corresponding to a smoke distribution in the boundary area by determining whether the particles are present in the boundary area, based on a comparison of the gradient of the smoke distribution to a threshold value.

17. The apparatus of claim 16, wherein the processor is configured to search a patch library, of the memory, for patches matching second descriptors that correspond to locations of the particles in the boundary area changed over time.

18. The apparatus of claim 17, wherein the processor is configured to calculate a difference between second descriptors, which comprise descriptors corresponding to the retrieved patches and descriptors having temporal continuity with other second descriptors, and the first descriptor corresponding to the second descriptors corresponding to the changed locations of the particles, and determine a patch to be the high-resolution patch that corresponds to the second descriptors or a new patch retrieved from the patch library based on a result of comparing the calculated difference to a preset value.

* * * * *